US012752336B2

(12) United States Patent
Li et al.

(10) Patent No.: US 12,752,336 B2
(45) Date of Patent: Oct. 6, 2026

(54) MECHANICAL LOCKING SPUTTERING TARGET BONDING METHOD AND TARGET ASSEMBLIES PRODUCED THEREBY

(71) Applicant: Honeywell International Inc., Charlotte, NC (US)

(72) Inventors: Suiqiong Li, Spokane, WA (US); Nishanth Selvaraj, Sriracha (TH); Stephane Ferrasse, Spokane, WA (US); Wayne Meyer, Cheney, WA (US); Michael Goodwater, Otis Orchards, WA (US)

(73) Assignee: Solstice Advanced Materials US, Inc., Morris Plains, NJ (US)

( * ) Notice: Subject to any disclaimer, the term of this patent is extended or adjusted under 35 U.S.C. 154(b) by 0 days.

(21) Appl. No.: 19/286,428

(22) Filed: Jul. 31, 2025

(65) Prior Publication Data

US 2026/0042142 A1 Feb. 12, 2026

Related U.S. Application Data

(60) Provisional application No. 63/682,051, filed on Aug. 12, 2024.

(51) Int. Cl.
*B21K 25/00* (2006.01)
*C23C 14/50* (2006.01)

(52) U.S. Cl.
CPC .............. *B21K 25/00* (2013.01); *C23C 14/50* (2013.01)

(58) Field of Classification Search
CPC ...... H01J 37/3435; B21K 25/00; C23C 14/50; C23C 14/3407
See application file for complete search history.

(56) References Cited

U.S. PATENT DOCUMENTS

| | | | | |
|---|---|---|---|---|
| 5,230,459 | A | 7/1993 | Mueller et al. | |
| 5,693,203 | A * | 12/1997 | Ohhashi | H01J 37/3435 428/673 |
| 5,857,611 | A * | 1/1999 | Gilman | C23C 14/3407 228/262.71 |
| 6,749,103 | B1 * | 6/2004 | Ivanov | C23C 14/3407 228/171 |
| 6,774,339 | B1 * | 8/2004 | Smathers | B23K 1/18 219/121.22 |
| 2007/0084719 | A1 * | 4/2007 | Wickersham, Jr. | C23C 14/3407 204/298.12 |

FOREIGN PATENT DOCUMENTS

| | | | |
|---|---|---|---|
| CN | 104625389 | A | 5/2015 |
| EP | 0575166 | A1 | 12/1993 |

* cited by examiner

*Primary Examiner* — Lee A Holly

(74) *Attorney, Agent, or Firm* — Faegre Drinker Biddle & Reath LLP

(57) ABSTRACT

A method of forming a bond in a sputtering assembly includes forming first projections on a bonding surface of a sputtering target, forming second projections on a bonding surface of a backing plate, aligning the sputtering target and the backing plate so that the first projections fit within the second recesses and the second projections fit within the first recesses to form an assembly; and applying pressure to the assembly so that first projections form an interlock bond between the sputtering target and the backing plate, wherein the interlock bond is void-free.

16 Claims, 12 Drawing Sheets

MECHANICAL LOCKING SPUTTERING TARGET BONDING METHOD AND TARGET ASSEMBLIES PRODUCED THEREBY

CROSS-REFERENCE TO RELATED APPLICATION

This application claims priority to Provisional Application No. 63/682,051, filed Aug. 12, 2024, which is herein incorporated by reference in its entirety.

TECHNICAL FIELD

The present disclosure relates a bonding process for a sputtering target.

BACKGROUND

Physical vapor deposition methodologies are used extensively for forming thin films of material over a variety of substrates. One area of importance for such deposition technology is semiconductor fabrication. A diagrammatic view of a portion of an exemplary physical vapor deposition ("PVD") apparatus 8 is shown in FIG. 1. In one configuration, a sputtering target assembly 10 comprises a backing plate 12 having a target 14 bonded thereto. A substrate 18 such as a semiconductive material wafer is within the PVD apparatus 8 and provided to be spaced from the target 14. A surface 16 of target 14 is a sputtering surface. As shown, the target 14 is disposed above the substrate 18 and is positioned such that sputtering surface 16 faces substrate 18. In operation, sputtered material 22 is displaced from the sputtering surface 16 of target 14 and used to form a coating (or thin film) 20 over substrate 18.

A secure bond between the target 14 and the backing plate 12 is important for optimizing the sputtering processes and achieving high-quality thin-film coatings. Prior methods for bonding include soldering, brazing, diffusion bonding, clamping and by epoxy cement. Some methods do not provide a sufficient bond, while other methods, such as diffusion bonding result in undesirable grain size growth, particularly in sputtering targets having a low melting point, such as aluminum and copper.

An improved method for bonding sputtering target assemblies is needed.

SUMMARY

Example 1 is a method of forming a bond in a sputtering assembly, the method including forming first projections on a bonding surface of a sputtering target, the first projections spaced from adjacent first projections by first recesses; forming second projections on a bonding surface of a backing plate, the second projections spaced from adjacent second projections by second recesses and the backing plate having a greater hardness than the sputtering target; aligning the sputtering target and the backing plate so that the first projections fit within the second recesses and the second projections fit within the first recesses to form an assembly; and applying pressure to the assembly so that first projections form an interlock bond between the sputtering target and the backing plate, wherein the interlock bond is void-free.

Example 2 is the method of Example 1 wherein the second projections have a dovetail cross sectional shape.

Example 3 is the method of Example 1 where in the first projections have a first height and the second projections have a second height, and the first height is greater than the first height.

Example 4 is the method of Example 1 wherein the width of the second projections is greater at the bonding than at the backing plate.

Example 5 is the method of Example 1 wherein a top surface of second projections on the backing plate does not touch a bottom surface of the first recesses on the sputtering target after aligning and before pressure is applied, and wherein the first projections are sized to completely fill the second recesses during the applying pressure step.

Example 6 is the method of Example 1 wherein the second projections have a M cross sectional shape.

Example 7 is the method of Example 1 wherein a height of the first projections increases radially outward from a center of the sputtering target and wherein the height of each of the first projections is less than a height of the second projections.

Example 8 is the method of any of Examples 1-7 and further comprising forming a bond under vacuum at a periphery region of the assembly after aligning and before applying pressure.

Example 9 is the method of any of Examples 1-7 and further comprising annealing the assembly after forming an interlock bond.

Example 10 is the method of any of Examples 1-7 wherein each of the first projections extends circumferentially about the sputtering target and adjacent first projections are radially spaced apart.

Example 11 is the method of any of Examples 1-7 wherein each of the second projections extends circumferentially about the backing plate and adjacent second projections are radially spaced apart.

Example 12 is the method of any of Examples 1-7 wherein the second projections are symmetrical after the step of applying pressure.

Example 13 is the method of any of Examples 1-7 wherein either the sputtering target or the backing plate has a ductility of at least 5%.

Example 14 is the method of any of Examples 1-7 wherein the interlock bond is void free as determined by C-Scan.

Example 15 is the method of any of Examples 1-7 wherein the interlock bond is formed at low temperature conditions at a temperature of less than 38° C.

Example 16 is the method of any of Examples 1-7 wherein the interlock bond is formed by isostatic pressing.

Example 17 is the method of Example 16 wherein the interlock bond is formed at low temperature conditions at a temperature of about 150° C. to about 250° C.

Example 18 is the method of any of Examples 1-7 wherein a yield strength of the sputtering target and a yield strength of the backing plate is sufficient to form the interlock bond.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Disclosed herein is a sputtering target assembly joined by mechanical locking and a method of making the same. In some embodiments, the bond is a low temperature bond, such as a bond that is formed at a temperature of about 38° C. or less.

Figure 1:
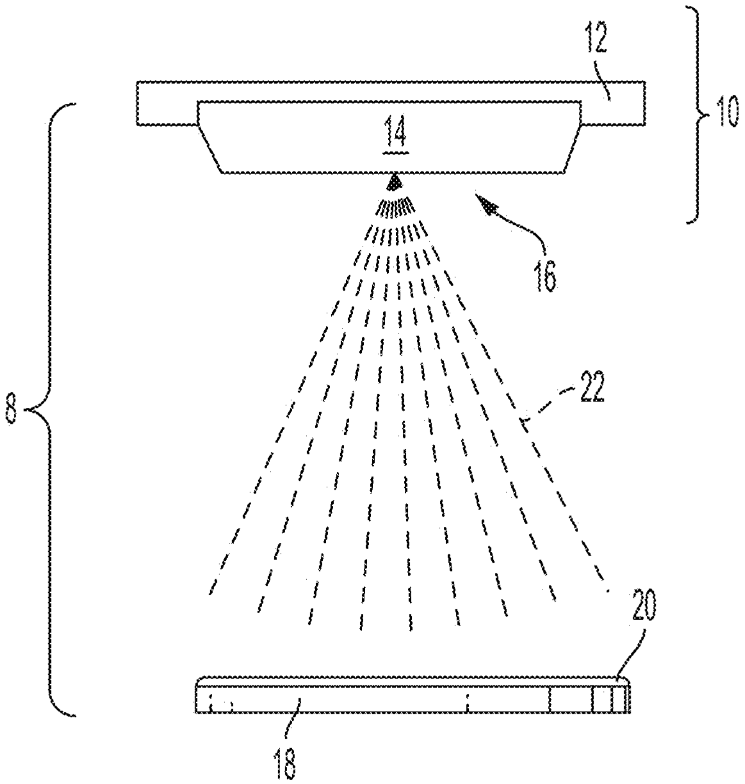
FIG. 1 is a schematic illustration of a sputtering apparatus.
Figure 2:
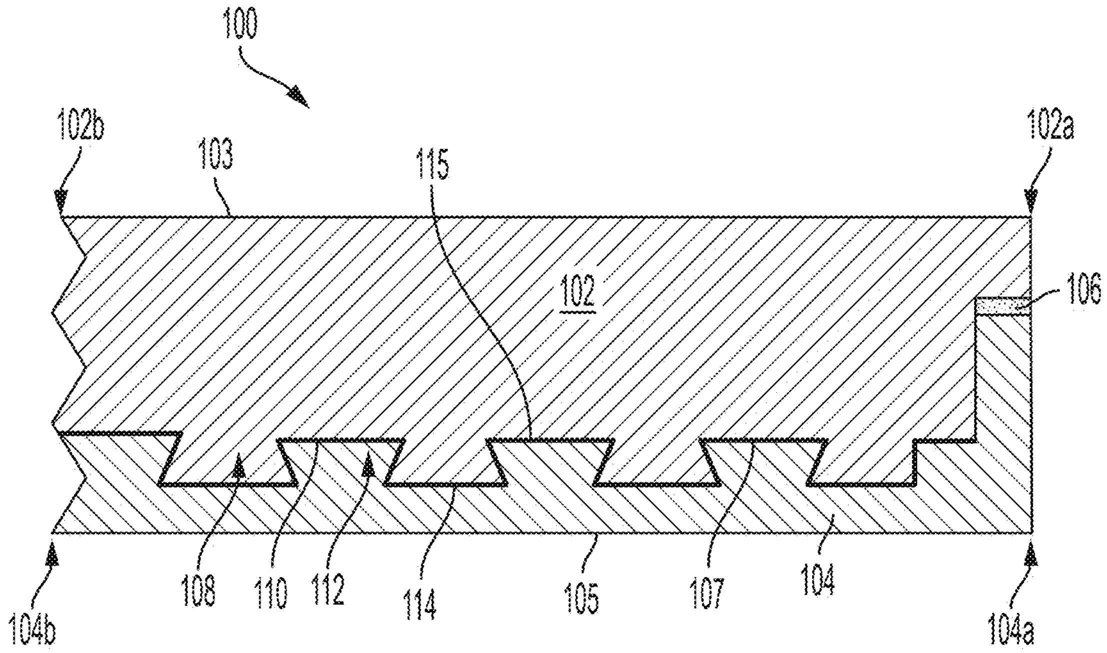
FIG. 2 is a cross-sectional view of a sputtering target assembly.

FIG. 2 is a cross-sectional schematic view of sputtering assembly 100, which includes sputtering target 102, backing plate 104 and weld 106. One skilled in the art will recognize that sputtering assembly 100 is an exemplary design and features, such as the location of weld 106, can be changed. Weld 106 attaches sputtering target 102 and backing plate 104 to create a vacuum between sputtering target 102 and backing plate 104. This assembly can also prevent contamination at interface of sputtering target 102 and backing plate 104. In some embodiments, weld 106 can be at the radially outward or peripheral portion of sputtering assembly 100. However, weld 106 may be at different location or a vacuum can be created between sputtering target 102 and backing plate 104 using a different method. Sputtering target 102 and backing plate 104 are bonded by interlock bond 107 along the interface between sputtering target 102 and backing plate 104.

Sputtering target 102 has radially inward portion **102*b* which surrounds and extends from the center of sputtering target 102 and radially outward or peripheral portion 102*a*. However, sputtering target 102 can have other shapes. Sputtering target 102 further includes sputtering surface 103 and target projections 108. Target projections 108 extend circumferentially, forming rings on sputtering target 102. Target projections 108 are radially space apart from one another by target recesses 110. Target projections 108 and target recesses 110 are located on the surface opposite sputtering surface 103**.

Backing plate 104 includes back face 105, backing plate projections 112 and backing plate recesses 114. Backing plate projections 112 and backing plate recesses 114 are located on the surface opposite back face 105. Backing plate projections 112 extend circumferentially and are spaced radially from one another so as to form rings on backing plate 104. Adjacent backing plate projections 112 are separated from one another by backing plate recesses 114. Backing plate projections 112 fit within target recesses 110 and target projections 108 fit within and fill backing plate recesses 114 to form an interlocking mechanical bond described herein. The bond is void-free and can be determined using C-Scan.

As described herein, target projections 108 are formed in sputtering target 102 and backing plate projections 112 are formed in backing plate 104 before sputtering target 102 and backing plate 104 are joined. When sputtering target 102 and backing plate 104 are joined, target projections 108 deform and fill backing plate recesses 114 forming bonding layer 115 at the interface of sputtering target 102 and backing plate 104.

In some embodiments, sputtering target 102 is formed of a metal or metal alloy which is softer than backing plate 104; backing plate 104 is formed of a material, such as a metal or metal alloy, which is harder (i.e., has a higher yield strength) than sputtering target 102. Example materials for sputtering target 102 include aluminum, copper, titanium, aluminum alloys and copper alloys. Example materials for backing plate 104 include aluminum alloys such as Al2014, Al6061, Al2024 and copper alloys such as CuZn, CuCr and CuCrNiSi (C1800). The softer material (the material with lower yield strength, i.e., sputtering target 102 in this embodiment) is formed from a material that has a ductility which allows it to deform sufficiently during the interlock bonding process described herein. In some embodiments, the sputtering target, the backing plate or the sputtering target and the backing plate have a ductility of at least 5%. The sputtering target and backing plate are also formed from materials having a sufficient difference in ductility such that the softer material (i.e., sputtering target 102 in this example) deforms sufficiently during the interlock bonding process described herein. In some embodiments, the yield strength of the sputtering target and the backing plate differ by at least 50%.

TABLE 1

Example sputtering target materials

| | Tensile Strength (ksi/MPa) | | Yield Strength (ksi/MPa) | | Hardness HB (500 Kg Load/ 10 mm ball) | Ductility (%) |
|---|---|---|---|---|---|---|
| Al/doped Al | 5-8 | 34-55 | 2-3 | 14-20 | <20 | >40 |
| Al0.5Cu | 13-15 | 90-103 | 7-8 | 40-50 | 24-26 | >30 |
| Cu | 31.9 | 220 | 13 | 90 | 45 | >25 |

TABLE 2

Example backing plate materials

| | Tensile Strength (ksi/MPa) | | Yield Strength (ksi/MPa) | | Hardness HB (500 Kg Load/ 10 mm ball) | Ductility (%) |
|---|---|---|---|---|---|---|
| Al6061 T6 | 45 | 310 | 39.9 | 275 | 95 | 12 |
| Al2024 T8 | 70 | 485 | 65.3 | 450 | 128 | 6 |

TABLE 2-continued

| Example backing plate materials | | | | | | |
|---|---|---|---|---|---|---|
| | Tensile Strength (ksi/MPa) | | Yield Strength (ksi/MPa) | | Hardness HB (500 Kg Load/ 10 mm ball) | Ductility (%) |
| Al2024 T351 | 68.2 | 470 | 47.1 | 325 | 120 | 20 |
| C18000 | 89.9-100 | 620-690 | 65-75 | 450-520 | 158 | 14 |
| CuCr | 45.8-53.7 | 315-370 | 31-38 | 213-260 | | >25 |
| CuZn | 50-52 | 344-360 | 19-21.5 | 130-148 | | >40 |

Figure 3:
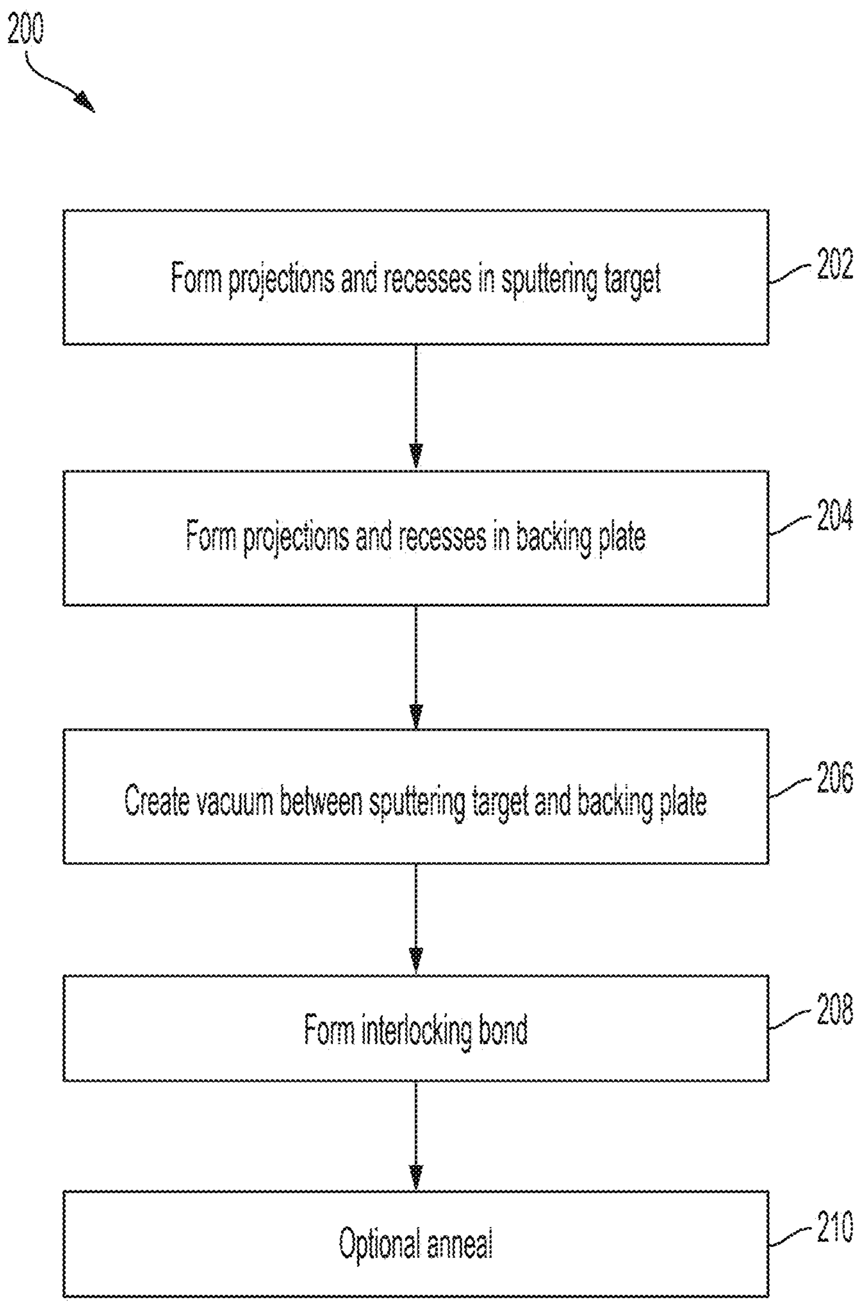
FIG. 3 is a flow chart for a method of making the sputtering target of FIG. 2.

FIG. 3 is flow chart of method 200 for making sputtering assembly 100. In step 202, projections and recesses are formed on the sputtering target on the surface opposite the sputtering surface of the sputtering target. As described herein, these projections and recesses are strategically designed to allow for a uniform and void-free interlocking of the sputtering target and the backing plate. In some embodiments, material is removed from the sputtering target to form the projections and recesses.

In step 204, projections and recesses are formed on the backing plate on a surface opposite the back face of the backing plate. In some embodiments, material is removed from the backing plate to form the projections and recesses. One skilled in the art will recognize that steps 202 and 204 can occur in any order.

In step 206, a vacuum is created between the sputtering target and the backing plate. First, the sputtering target having the formed projections and recesses is aligned with the backing plate having the formed projections and recesses. For example, the projections of the sputtering target fit within the recesses of the backing plate. In this way, the sputtering target and the backing plate are positioned to create an interface defined by their mating surfaces. In some embodiments, a vacuum is then created between the sputtering target and backing plate by bonding the peripheral portion of this interface using E-beam welding. The peripheral bond, because it is created under vacuum, also results in removal of the air between the backing plate and the sputtering target. Thus, there is no air between the parts during the interlock bond of step 208. The E-beam weld also holds the assembly together during the interlock bond of the next step.

In step 208, an interlock bond is formed between the sputtering target and backing plate. The bonding process can be a low temperature bond process. In some examples, the interlock bond can be formed by using one of the following processes: (1) pressing or forging, (2) rolling (3) pressing followed by rolling or (4) isostatic pressing. In some embodiments, the forge or rolling process can be performed at room temperature, about 20-22° C. For example, the pressing or forging, rolling, pressing followed by rolling or isostatic pressing can be performed at about room temperature. In other embodiments, the forging or rolling process is performed at a temperature above room temperature. In some embodiments, the process is performed at a temperature above room temperature and below the peak aging temperature of the sputtering target. In one example, the process is conducted at less than about 38° C. In another example, the sputtering target and/or backing plate can be heated (for example to about 300° C.) and then forged or rolled at the elevated temperature. In a still further example, the interlock bond can be formed by isostatic pressing at a temperature of about 150° C. to about 250° C. or about 150° C. to about 200° C. The elevated temperature can make the sputtering target and/or backing plate softer, thus allowing the materials to more easily deform during the forging or rolling.

In one example, where the backing plate is an aluminum alloy, the aluminum alloy backing plate is heated treated before the forging or rolling step. In one embodiment, the harder material (i.e., the backing plate) can be heat treated at a temperature below the peak aging temperature of the material. For example, the aluminum alloy backing plate can be heat treated at temperature below the peak aging temperature (typical range is about 150-250° C. for about 2-12 hours for most aluminum alloy backing plate materials). Additionally, or alternatively, the softer material (i.e., the sputtering target) can be heat treated at temperatures above the peak aging temperature for the material. For example, an aluminum or aluminum alloy sputtering target can heat treated at about 250-350 C; copper and copper alloy sputtering targets (i.e., Cu, CuAl, CuMn) can be heat treated at about 250° C.-550° C. for about 0.5-2 hours; titanium material can be heat treated at about 250-500° C. for about 0.5-1 hours. In some embodiments, a rolling process creates shear deformation along the bonding interface, which breaks the oxidation layers on either or both of the target and the backing plate and can improve the diffusion between the target and the backing plate and the bond strength.

When a material undergoes forging, it is pressed from the top, causing the material to deform primarily in a downward and outward direction. Forging can cause a three-dimensional change in shape such that the target projections deform to fill the backing plate recesses.

When a material is rolled, the material is passed between two rollers, which compress the material primarily in the horizontal direction. Thus, the rolling process primarily elongates the material. The deformation of the target projections may be more uniform and two-dimensional when rolling is used compared to forging. Rolling may also cause more deformation along the bonding interface of the sputtering target and backing plate (bonding layer 115) compared to forging. This surface deformation may break the oxide layer of the interface surface of the sputtering target and/or backing plate.

As discussed herein, a material interlock bond is formed between the sputtering target and the backing plate. The bond between the sputtering target and the backing plate may be further strengthen or enhanced if there is also material diffusion between the sputtering target and the backing plate. For some metals, such as aluminum and aluminum alloys, an oxide layer quickly and/or easily forms on exposed surfaces and may prevent material diffusion. Breaking the oxide layer can improve the material diffusion and thus improve bonding between the sputtering target and backing plate.

In step 210, the sputtering target assembly can optionally be annealed. In some embodiments, an annealing process can further improve the bond strength. The annealing process causes material diffusion between the target and the backing plate. As discussed herein, material diffusion can further strengthen or enhance the bond between the sputtering target and the backing plate.

Figure 4:
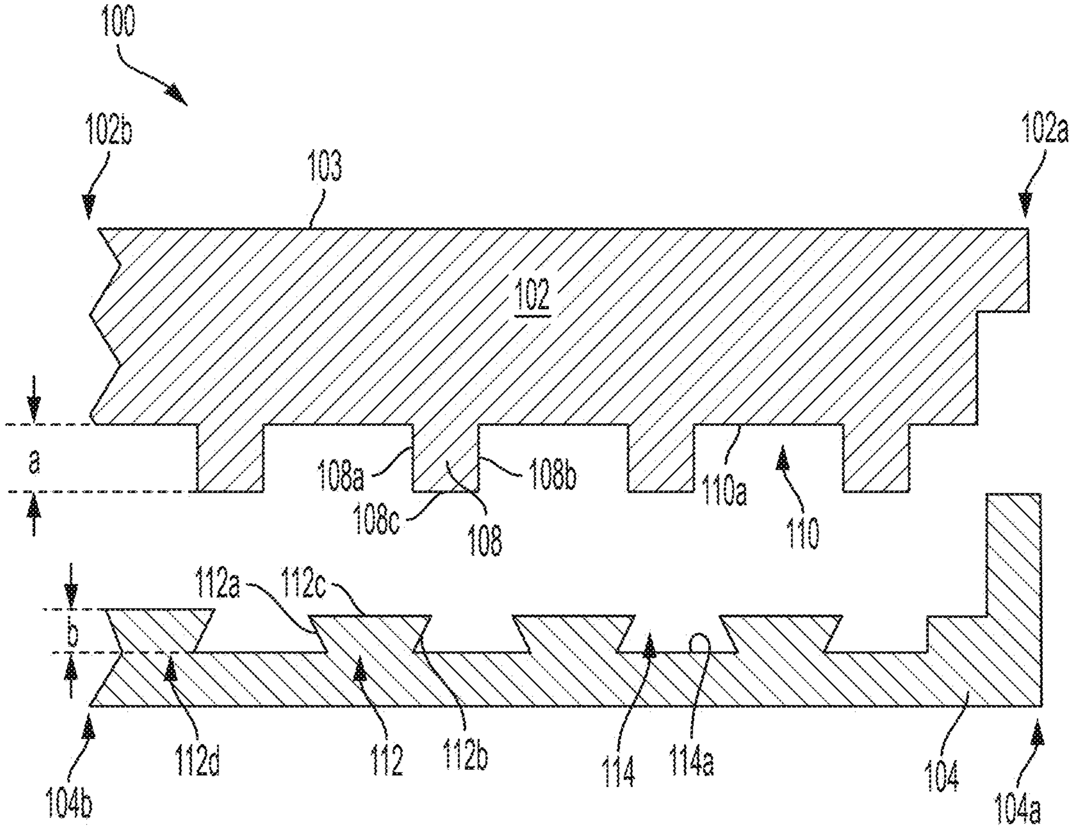
FIG. 4 is a cross sectional, exploded view of the sputtering target assembly of FIG. 2 before bonding.

FIG. 4 is a cross-sectional schematic of sputtering target 102 and backing plate 104 after formation of target projections 108, target recesses 110, backing plate projections 112 and backing plate recesses 114. Target projections 108 are formed by side walls 108*a* and 108*b* and bonding surface 108*c*, and target recesses 110 are defined by side walls 108*a* and 108*b* and bonding surface 110*a*. Target projections 108 and target recesses 110 extend circumferentially, forming radially spaced rings on sputtering target 102. Target projections 108 and target recesses 110 are located on the surface opposite sputtering surface 103. Target projections 108 extend opposite sputtering surface 103. Adjacent target projections 108 are radially separated from one another by target recesses 110. Target projections 108, target recesses 110, backing plate projections 112 and backing plate recesses 114 are designed to form a uniform and void-free interlock between sputtering target 102 and backing plate 104.

Target projections 108 have a cross-sectional shape of one of various shapes. In some embodiments, the cross-sectional shape of target projections 108 are square or rectangular. As described herein, the shape of target projections 108 is selected to result in a void-free bond. The height of target projections 108 is measured between bonding surface 110*a* of sputtering target recess 110 and bonding surface 108*c* of sputtering target projection 108. The height is designated as "a" in FIG. 4. In some embodiments, the height of target projections 108 is uniform. That is, each of target projections 108 have the same height. The shape of target projections 108 is designed so that during the interlocking mechanical bonding process, target projections 108 deform and the material completely filles the spaces between sputtering target 102 and backing plate 104, creating a void-free bond.

Backing plate projections 112 have side walls 112*a* and 112*b* and bonding surface 112*c* and backing plate recesses 114 are defined by side walls 112*a* and 112*b* and bonding surface 114*a*. The cross-sectional shape of backing plate projections 112 can be one of various shapes. In some embodiments, the cross-sectional shape of the backing plate projections 112 are generally trapezoidal. In some embodiments, the cross-sectional shape of backing plate projections 112 can be dovetail shaped with the wider base at bonding surface 112*c* and the width of backing plate projection 112 narrowing as it connects to backing plate 104. For example, the width of backing plate projection 112 may be widest at the distal end and narrows as you move towards a proximal end of backing plate projections 112 (i.e., bonding surface 114*a* of backing plate 104.) That is, backing plate projection 112 is wider at bonding surface 112*c* than at interface 112*d* where backing plate projection 112 interfaces with backing plate 104. When sputtering target 102 and backing plate 104 are forged or rolled, target projection 108 deforms and fills backing plate recess 114, which results in the formation of interlocks between sputtering target 102 and backing plate 104. The height of backing plate projections is measured between bonding surface 114*a* of backing plate recesses 114 and bonding surface 112*c* of backing plate projections 112. The heigh of backing plate projections 112 is designed as "b" in FIG. 4.

Figure 5:
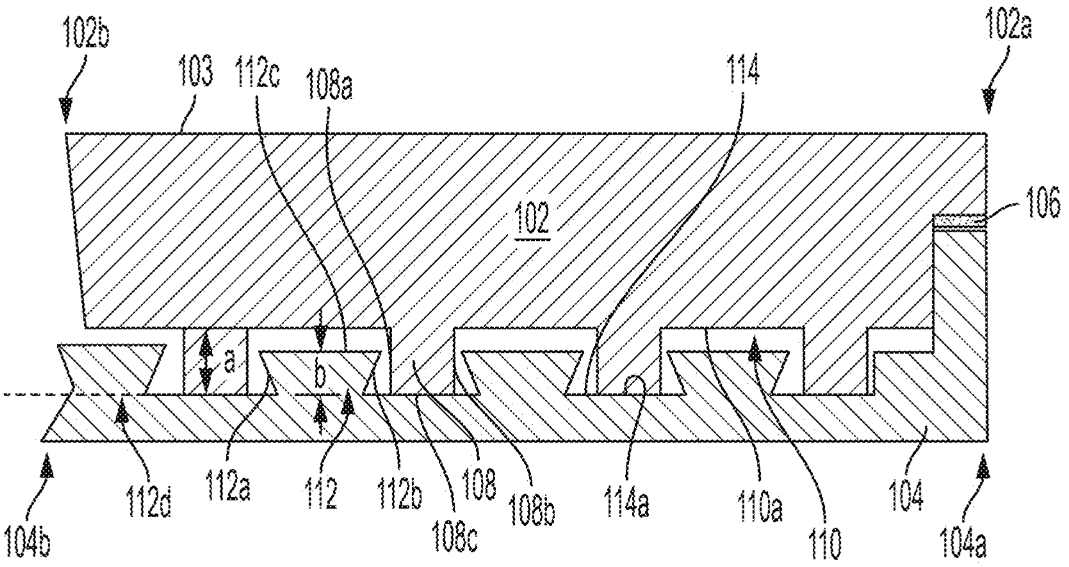
FIG. 5 is a cross-sectional view of the sputtering target assembly of FIG. 2 before bonding.

FIG. 5 is a cross-sectional schematic illustration of sputtering target 102 aligned with backing plate 104 after Step 206 and before Step 208. As shown, backing plate projections 112 fit within target recesses 110 and target projections 108 fit within backing plate recesses 114 to form an interlocking mechanical bond described herein. The height of target projections 108 is greater than the height of backing plate projections 112 (e.g., "a" is greater than "b"). Because "a" is greater than "b," bonding surface 112*c* of backing plate projection 112 does not touch bonding surface 110*a* of target recess 110. When the parts are forged or rolled, target projection 108 will deform and fill the spaces between backing plate projections 112 (i.e., backing plate recesses 114). In some embodiments, the bonding surface 112*c* of backing plate projection 112 does not touch bonding surface 110*a* of target recess 110 before the spaces between backing plate projections 112 are almost filled. In this way, the outward flow of the target material will not apply large force on backing plate projections 112. This also contributes to a more uniform bonding will be formed.

In some embodiments, the volume of a target projection 108 is the same as or substantially similar to the volume of backing plate recess 114 to which it is aligned. In this way, target projection 108 can fill or substantially fill backing plate recess 114 to which it is aligned during the forging or rolling process. In some embodiments, substantially can be ±0.5%, ±1%, ±3% or ±5%.

In some embodiments, as shown in FIG. 5, weld 106 can be present at the peripheral of the sputtering target.

When the interlocking mechanical bond is formed in step 208, for example by pressing or rolling, target projections 108 of sputtering target 102 deform and fill up the spaces between sputtering target 102 and backing plate 104 as shown in FIG. 2. For example, projections 108 can deform and fill the space between adjacent projections 112 of backing plate 104. Additionally, the pressing or rolling pushes sputtering target 102 downward such that surface 108*c* of target projection 108 is in contact with surface 114*a* of backing plate recess 114. In this way, the surface of sputtering target 102 opposite sputtering surface 103 can be fully in contact with the surface of backing plate 104 opposite back face 105.

The outward deformation of the major target body applies little force on backing plate projections 112 before bonding surface 110*a* of sputtering target and bonding surface 112*c* of backing plate 104 contact and in some embodiments, backing plate projections 112 experience little deformation during the interlock bonding. A uniform bond forms between the entire bonding surface of sputtering target 102 and backing plate 104. The bond is void-free. In some embodiment, C-Scan can be used to determine if the bond is void-free.

Figure 6:
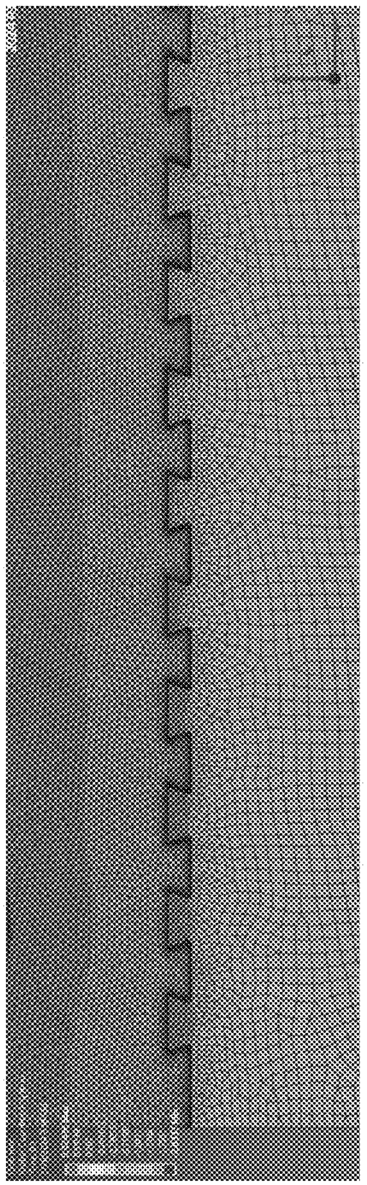
FIG. 6 is a simulation of the bond of sputtering target assembly of FIG. 2.

FIG. 6 shows simulation results of the bonding using Finite Element Modeling (FEM) method with Ansys simulation software. The simulation shows how the material of sputtering target 102 and backing plate 104 will flow when pressed with a forge press. Sputtering target 102 is the piece at the top of the image and backing plate 104 is the piece at the bottom of the image. This simulation shows no voids in the bond between the sputtering target and backing plate. Further, no deformation of the backing plate projections is seen such that the backing plate projections remain symmetrical (i.e., a symmetrical bond). An interlocking mechanical bond is formed. This simulation will also identify the optimum stopping condition of the forge press to achieve overall height 'C' in the sputtering target assembly where no voids are visibly seen in the mechanical bonding.

Figure 7:
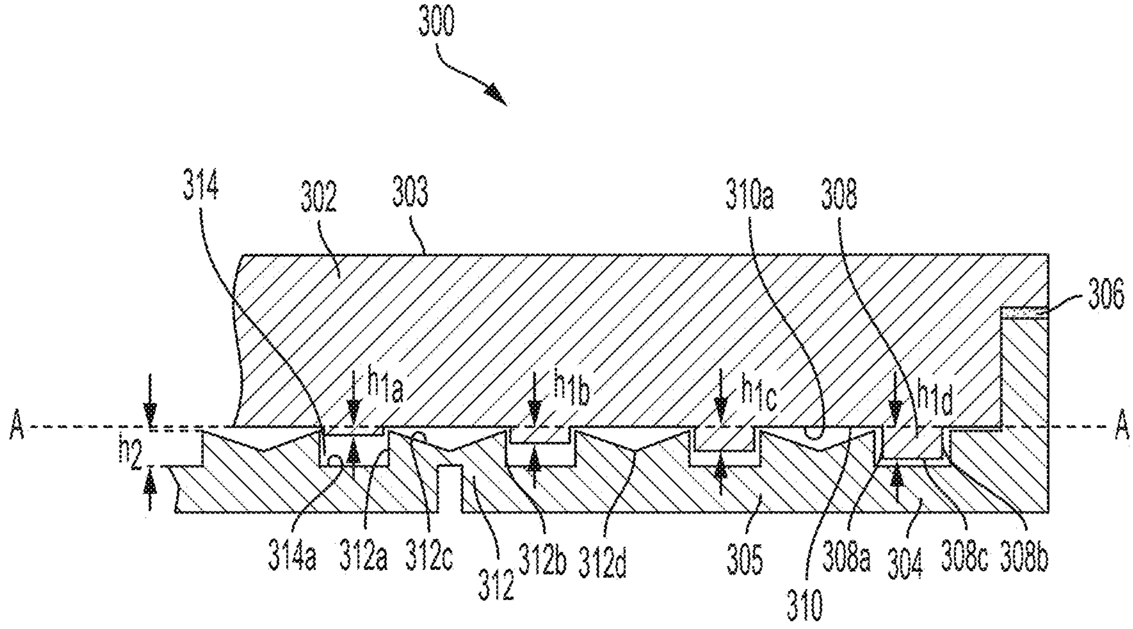
FIG. 7 is a cross-sectional view of an alternative sputtering target assembly before bonding.

FIG. 7 is a cross-sectional schematic illustration of an alternative embodiment showing sputtering target assembly 300 having sputtering target 302, backing plate 304 and weld 306. In some embodiments, sputtering target 302 can be formed of a softer material than backing plate 304 as described herein for sputtering target 102 and backing plate 104. Weld 306 is similar to weld 106 and sputtering target assembly can be formed by method 200.

Figure 8:
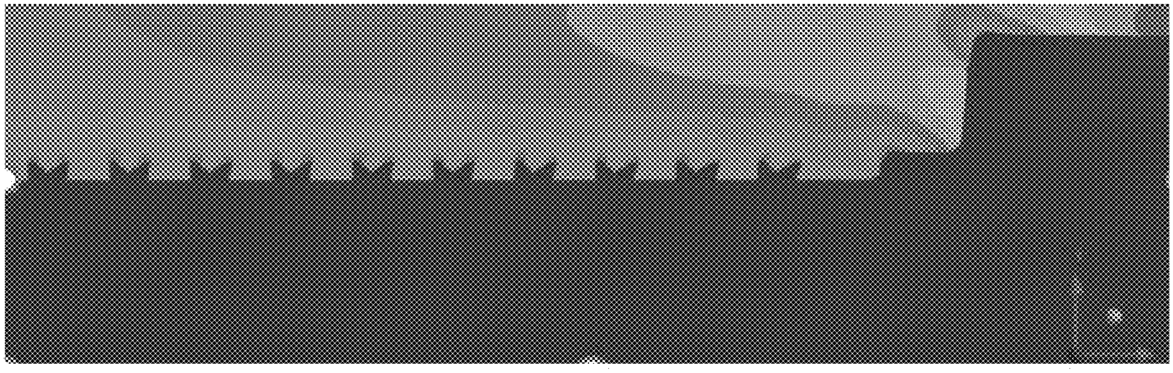
FIG. 8 is a simulation of the sputtering target assembly of FIG. 7.

Sputtering target 302 includes sputtering surface 303, target projections 308 (having side walls 308*a* and 308*b* and bonding surface 308*c*) and target recesses 310 (defined by side walls 308*a* and 308*b* and bonding surface 310*a*). Target projections 308 and target recesses 310 are located on the surface opposite sputtering surface 303. Target projections 308 extend opposite sputtering surface 303. Adjacent target projections 308 are separated from one another by target recesses 310. In some embodiments, as shown in FIG. 8, height $h_1$ of target projections 308 can be non-uniform. For example, height $h_1$ of target projections 308 can increase as you move radially outwards from the center of sputtering target 302 (i.e., from left to right in FIG. 7), such that $h_{1d}$ is greater than $h_{1c}$.

Backing plate 304 includes back face 305, backing plate projections 312 (having side walls 312*a* and 312*b* and bonding surface 312*c*) and backing plate recesses 314 (defined by side walls 312*a* and 312*b* and bonding surface 314*a*). Backing plate projections 312 and backing plate recesses 314 are located on the surface opposite back face 305. Backing plate projections 312 extend opposite back face 305. Adjacent backing plate projections 312 are separated from one another by backing plate recesses 314. Backing plate projections 312 fit within target recesses 310 and target projections 308 fit within backing plate recesses 314 to form an interlocking mechanical bond described herein.

In this embodiment, backing plate projections 312 have an "M" cross-sectional shape. That is, backing plate sidewalls 312*a* and 312*b* are taller than a point at the center of backing plate projections 312 such that bonding surface 312*c* slopes down from both sidewalls 312*a* and 312*b* to center point 312*d*. Bonding surface 312*c* is not horizontally level. Backing plate projections 312 can have a height measured at along backing plate sidewalls 312*a* and 312*b* of $h_2$. The height $h_2$ of backing plate projections 312 can be greater than height $h_1$ of each of sputtering target projections 308.

When the interlocking mechanical bond is formed in step 208, for example by pressing or rolling, projections 312 of backing plate 304 are pushed into the softer material of sputtering target 302 and form a hook-like structure. At the same time, projections 312 undergo large outward stress because of the outward material flow of sputtering target 302. This stress reaches the maximum at the outermost area and could result in undesired deformation of the hook-like structure, weaking the bond strength. Due to the gradient aspect ratios of the mating projections and recesses, backing plate recesses 314 between backing plate projections 312 on the radially outward positions are filled up first, blocking the undesired outward deformation. Uniform and symmetric hook-like bond form across the entire bonding surface of backing plate 304 and sputtering target 302. The bond is void-free and uniform. In some embodiment, C-Scan can be used to determine if the bond is void-free.

FIG. 8 shows simulation results of the bonding The simulation shows how the materials will flow under the forge press. The sputtering target is at the top of the image and the backing plate is at the bottom of the image. This simulation shows no voids and there is no deformation of the backing plate projections (i.e., a symmetrical bond). An interlocking mechanical bond is formed.

While the sputtering target has been described herein as formed from a softer material than the backing plate, one skilled in the art will recognize that the sputtering target can be formed from a harder material than the backing plate. In such a case, the protrusions and recesses on the backing plate and sputtering target can be switched. That is, one skilled in the art will recognize that features described herein as the backing plate protrusions and recesses are formed on the harder part and the feature described as the sputtering target protrusions and recesses are formed on the softer part.

As described herein, target projections 108 and backing plate projections 112 can extend circumferentially, forming rings and are radially spaced apart. In an alternative embodiment, target projections 108 and backing plate projections 112 can be straight lines that are spaced apart from one another. In some embodiments, assembly is performed by sliding the target into the backing plate along a straight line. In some embodiments, the male projection can have a similar cross section to the female recesses.

The present invention is more particularly described in the following examples that are intended as illustrations only, since numerous modifications and variations within the scope of the present invention will be apparent to those of skill in the art. Unless otherwise noted, all parts, percentages, and ratios in the following examples are on a weight basis. As used herein the term "about" means ±10%, ±5% or ±1%.

Example 1

Figure 9:
FIG. 9 is image of the cross section at a bond line of an example target assembly.

"M" shaped projections were machined in the backing plate at the bonding interface with the sputtering target. Projections were not machined in the sputtering target at the bonding interface. That is, the sputtering target had a flat or substantially flat surface at the bonding interface with the backing plate. The backing plate and sputtering target were aligned and pressed. The assembly was cut, and the bonding interface was examined. An image of the cross section at the bond line is shown in FIG. 9, in which the sputtering target is at the top of the image and the backing plate is at the bottom of the image. After pressing, the projections on the backing plate are pushed into the sputtering target to form a bond. However, at the radial edge of the assembly, the projections on the backing plate are pushed outward and the bond is not uniform. A void is also seen at the edge of the assembly. The outward movement of the backing plate projections may be caused by the outward material flow of the sputtering target during the pressing.

Example 2

Figure 10:
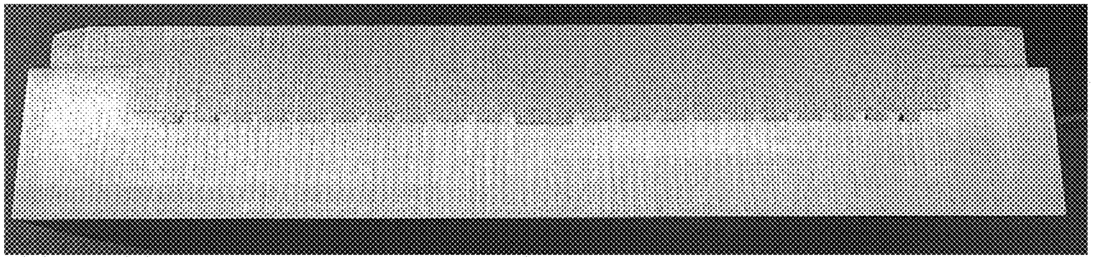
FIG. 10 is image of the cross section at a bond line of an example target assembly.

Projections were machined on the sputtering target and the backing plate. The projections all had the same height. The backing plate and sputtering target were aligned and pressed. The assembly was cut, and the bonding interface was examined. An image of the cross section at the bond line is shown in FIG. 10, in which the sputtering target is the piece at the top of the image and the backing plate is the piece at the bottom of the image. Voids in the bonding layer, especially at the most outward cycles (towards the radial edge) are observed.

Example 3

Figure 11:
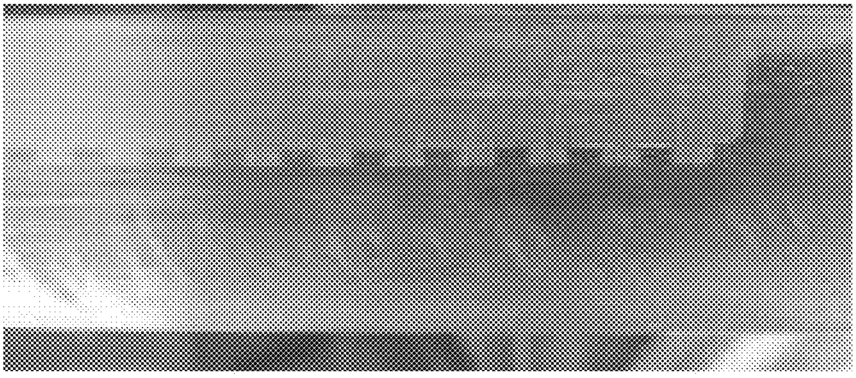
FIG. 11 is image of the cross section at a bond line of an example target assembly.
Figure 12:
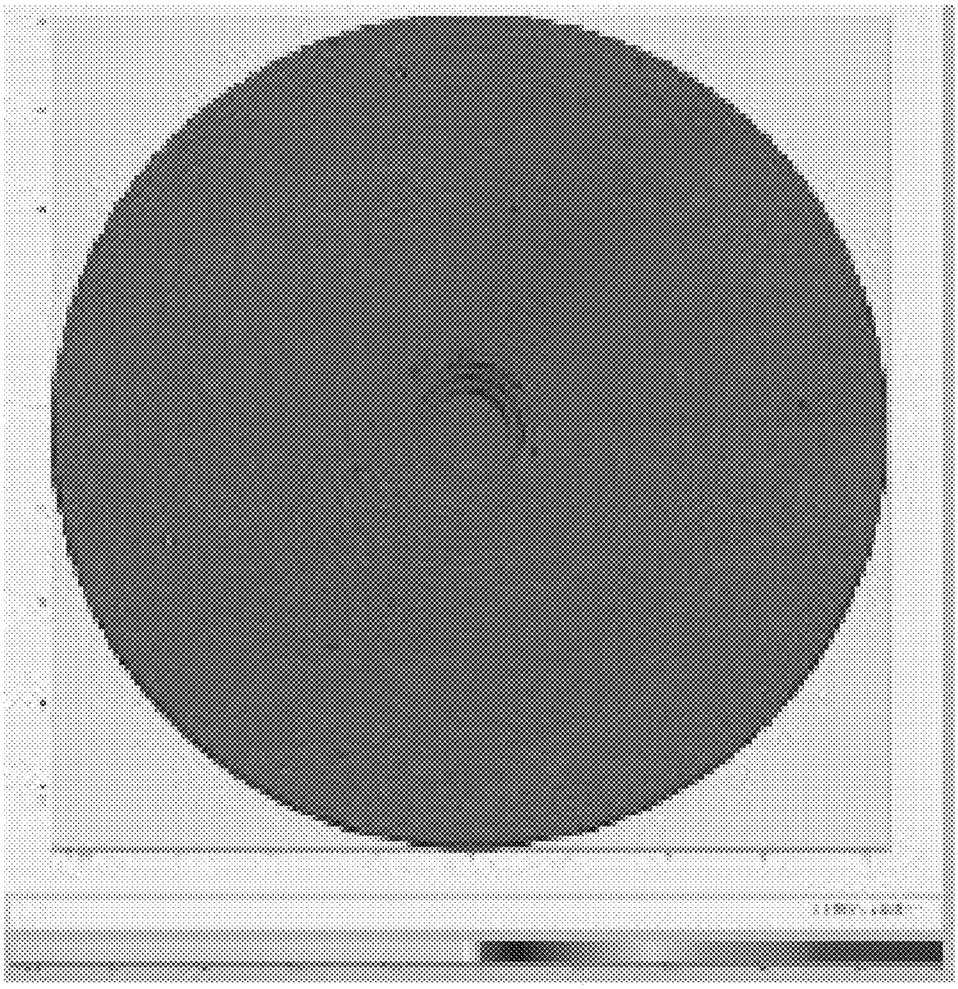
FIG. 12 is a c-scan image of the example target assembly of FIG. 11.

A pure aluminum sputtering target having an 18-inch diameter was formed having the projections shown in FIG. 4, and a Al2024 T851 backing plate was formed having the projections shown in FIG. 4. The sputtering target and backing plate were aligned and pressed. The assembly was cut, and the bonding interface was examined. An image of the cross section at the bond line is shown in FIG. 11. The backing plate projections are uniform. The bond is void-free as determined visually in FIG. 11 and in the C-Scan image of FIG. 12.

In this example, the height of the projections on target are greater than the height of the projections on the backing plate. After pressing, the bonding was formed. FIG. 11 shows there are no voids in the bonding layer between the target and the backing plate. Additionally, the interlocks are uniform. The locks (i.e., backing plate projections) at the center are the same as the locks at the outward area. No outward deformation was observed.

An ultrasound C-Scan was used to detect any defects in the bonding layer. No defects were detected.

After bonding, the Brinell Hardness (HB) of the backing plate was determined to be 119 using ISO 6506. For comparison, the Brinell Hardness of the backing plate of a diffusion-bonded target with the same materials is ~95. This result shows the bonding method improves the target assembly strength compared with diffusion bonding.

After bonding, the grain size of the sputtering target was measured to range from 150~200 μm. In comparison, the grain size of a similar diffusion-bonded target is ~300 μm. The low temperature bond disclosed herein allows for a smaller grain size to be achieved in the sputtering target than through diffusion bonding. Grain size was measuring using ASTM E112, titled "Standard Test Methods for Determining Average Grain Size." The bonding design described herein also shows advantages of forming uniform, defect-free bonding.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above-described features.

What is claimed is:

1. A method of forming a bond in a sputtering assembly, the method comprising:

forming first projections on a bonding surface of a sputtering target, the first projections extending circumferentially to form rings on the sputtering target and radially spaced from adjacent first projections by first recesses, each first projection having a first height;

forming second projections on a bonding surface of a backing plate, the second projections extending circumferentially to form rings on the backing plate and radially spaced from adjacent second projections by second recesses, each second projection having a second height, and the backing plate having a greater hardness than the sputtering target;

aligning the sputtering target and the backing plate so that the first projections fit within the second recesses and the second projections fit within the first recesses to form an assembly, and wherein a stop projection extends from backing plate at the periphery, the stop projection having a height greater than the first height of each of the first projections and the second height of each of the second projections, wherein after aligning the sputtering target and the backing plate, the stop projection is immediately adjacent to and radially outward of at least a portion the sputtering target;

after aligning the sputtering target and the backing plate, forming a bond between the stop projection and the sputtering target under vacuum, wherein after forming the bond, each first projection has the first height, and each second projection has the second height; and applying pressure to the assembly to deform at least one of the first projections and the second projections to form an interlock bond between the sputtering target and the backing plate, wherein the interlock bond is void-free.

2. The method of claim 1 wherein the second projections have a dovetail cross-sectional shape.

3. The method of claim 1 wherein the first height is greater than the second height.

4. The method of claim 1 wherein the second projections have a distal end and a proximal end, and a width of the second projections decreases from the distal end to the proximal end.

5. The method of claim 1 wherein a top surface of second projections on the backing plate does not touch a bottom surface of the first recesses on the sputtering target after aligning and before pressure is applied, and wherein the first projections are sized to completely fill the second recesses during the applying pressure step.

6. The method of claim 1 wherein the second projections have a M cross-sectional shape.

7. The method of claim 1 wherein the first height of the first projections increases radially outward from a center of the sputtering target and wherein the first height of each of the first projections is less than the second height of the second projections.

8. The method of claim 1, wherein the bond formed under pressure is an e-beam weld.

9. The method of claim 1 and further comprising annealing the assembly after forming the interlock bond.

10. The method of claim 1 wherein either the sputtering target or the backing plate has a ductility of at least 5%.

11. The method of claim 1 wherein the interlock bond is void free as determined by C-Scan.

12. The method of claim 1 wherein applying pressure to the assembly to form the interlock bond occurs at a temperature of less than 38° C.

13. The method of claim 1 wherein applying pressure to the assembly to form the interlock bond is by isostatic pressing.

14. The method of claim 1 wherein applying pressure to the assembly to form the interlock bond occurs at a temperature of about 150° C. to about 250° C.

15. The method of claim 1 wherein a yield strength of the sputtering target and the backing plate differ by at least 50%.

16. The method of claim 1 wherein the first projections have a rectangular cross-sectional shape.

* * * * *